United States Patent
Tu et al.

(10) Patent No.: US 7,239,333 B2
(45) Date of Patent: Jul. 3, 2007

(54) LED ARRAY PACKAGE STRUCTURE AND METHOD THEREOF

(75) Inventors: Shun-Lih Tu, Taipei (TW); Chih-Hung Chuang, Hsinchu (TW); Huai-Ku Chung, Hsinchu (TW); Chia-Feng Yang, Yungho (TW); Cheng-Wei Yang, Chilung (TW); Tsu-An Han, Kaohsiung Hsien (TW); Hung-Tung Wang, Hsinchu (TW); Chien-Chen Hung, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 244 days.

(21) Appl. No.: 11/038,125

(22) Filed: Jan. 21, 2005

(65) Prior Publication Data

US 2006/0132578 A1  Jun. 22, 2006

(30) Foreign Application Priority Data

Dec. 22, 2004 (TW) .............................. 93140105 A

(51) Int. Cl.
*B41J 2/45* (2006.01)
*H01L 27/00* (2006.01)
*H01L 21/70* (2006.01)
*H01L 21/77* (2006.01)
*H01L 21/78* (2006.01)

(52) U.S. Cl. ....................................... 347/130; 347/238
(58) Field of Classification Search ................ 347/130, 347/233, 238
See application file for complete search history.

(56) References Cited

U.S. PATENT DOCUMENTS 5,550,088 A * 8/1996 Dautartas et al. ............... 216/2

* cited by examiner

*Primary Examiner*—Huan Tran
(74) *Attorney, Agent, or Firm*—Rosenberg, Klein & Lee

(57) ABSTRACT

According to the method, a trench structure is formed in a substrate. LED arrays and driver ICs are located in the corresponding trenches. An insulating layer is formed over the substrate, the LED arrays and the driver ICs. A photolithography process forms an electrical connection structure between the LED arrays and the driver ICs. Then, a die-cutting process cuts out individual units. These units are fixed in a PCB and an electrical connection structure is formed between these units and input/output pins on the PCB.

30 Claims, 16 Drawing Sheets

LED ARRAY PACKAGE STRUCTURE AND METHOD THEREOF

RELATED APPLICATIONS

The present application is based on, and claims priority from, Taiwan Application Serial Number 93140105, filed on Dec. 22, 2004, the disclosure of which is hereby incorporated by reference herein in its entirety.

FIELD OF THE INVENTION

The present invention relates to a package structure and method thereof and more particularly to a light emitting diode (LED) package structure and method thereof.

BACKGROUND OF THE INVENTION

In the typical printer technology, a laser is used as a light source in a printer head to scan and transfer the printing information to a rotating drum. The best advantage of using a laser in a printer head is that the scattering phenomenon is almost eliminated. However, the optical structure is quite complex and difficult to reduce in size for using a laser in this way. Therefore, the current trend is toward using light emitting diodes to replace lasers as the light sources in printer heads, which can simplify the optical structure.

FIG. 1 is a schematic diagram of a conventional printer. The light emitting diode arrays 102 in the printer head 100 are the light source. When printing, the light from the light emitting diode arrays 102 illuminate the rotating drum 106 through a focusing prism 104. Static electricity is produced in the illuminated regions of the rotating drum 106. The carbon held in the toner cartridge 108 is attracted by this static electricity generated in the rotating drum 106. The attracted carbon is printed onto a paper 110 via the rotating drum 106. Next, the paper 110 is heated to fix this carbon in place.

A light emitting diode is related to a point of the image being developed on the paper. In other words, the resolution of a printer is related to the number of light emitting diodes per unit area. For example, a printer with 600 dpi resolution requires about 5000 light emitting diodes in the printer head for printing an A4 size paper. Therefore, the printer head 100 is composed of twenty-six light emitting diode arrays 102, wherein each LED array 102 is composed of 192 light emitting diodes to form printing points.

A further requirement is to reduce the volume of each light emitting diode so as to increase the resolution of the printer. More light emitting diodes may be constructed per unit area in the printer head when the volume of each light emitting diode is reduced. According to the typical packaging method as illustrated in FIG. 2, a highly precise packaging apparatus is required to arrange the light emitting diode arrays 102 and the driver integrated circuits 112 so that they are exactly parallel to each other in a printed circuit board 114. Then, a wire bonding process is performed to form about 5000 wires 116 between the light emitting diode arrays 102 and the driver integrated circuits 112 if the resolution of the printer is 600 dpi. The driver integrated circuits 112 drive the light emitting diode arrays 102 through these wires 116.

A highly exact and dense wire bonding process in the foregoing method increases the difficulty of the packaging process. This reduces the product yield and indirectly raises the manufacturing cost. Moreover, reducing the volume of the light emitting diodes, although increasing the resolution of the printer, further increases the packaging difficulty.

Furthermore, according to the typical packaging method, the wire bonding process is performed after all the driver integrated circuits and the light emitting diode arrays are arranged in the printed circuit board. Therefore, the electrical connection detection is performed after the wire bonding process. Consequently, if a defective light emitting diode array or driver integrated circuit is found, the reworking process includes dismantling the failed product from the printed circuit board and replacing it with a new product. This reworking process is difficult and tedious.

Therefore, a new package structure and method thereof is required to resolve the foregoing problems.

SUMMARY OF THE INVENTION

Therefore, it is the main object of the present invention to provide a light emitting diode array package structure and method thereof that does not require a highly dense wire bonding process.

Another purpose of the present invention is to provide a light emitting diode array package structure and method that uses a photolithography process instead of the typical wire bonding process to form wires between the LED arrays and driver integrated circuits.

Yet another purpose of the present invention is to provide a method for manufacturing a printer head with light emitting diode arrays.

In accordance with the present invention, a light emitting diode array packaging method is provided. According to the method, a trench structure is formed in a substrate first. Next, the light emitting diode arrays and the driver integrated circuits are located in corresponding trenches. Then, an insulating layer is formed over the substrate, the light emitting diode arrays and the driver integrated circuits. A photolithography process forms an electrically connected structure between the light emitting diode arrays and the driver integrated circuits. Next, a die-cutting process forms individual units. These individual units are fixed in a printed circuit board. Finally, a wire bonding process electrically connects the input/output pins respectively located on the driver integrated circuits and the printed circuit board.

In addition, the present invention also provides a light emitting diode array package structure. The structure of the present invention comprises a printed circuit board with at least one input/output pin and a substrate connected with the printed circuit board. A trench structure is formed in the substrate, and at least one light emitting diode array and one driver integrated circuit are located in corresponding trenches. A first electrical connection structure is formed between the light emitting diode array and the driver integrated circuit. A second electrical connection structure is formed between the driver integrated circuit and the input/output pin in the printed circuit board.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENTS

To reduce the difficulty of the wire bonding process as well as avoid lower product yield, a photolithography process is introduced into the present invention to form the electrical connections between the light emitting diode arrays and the driver integrated circuits.

Figure 1:
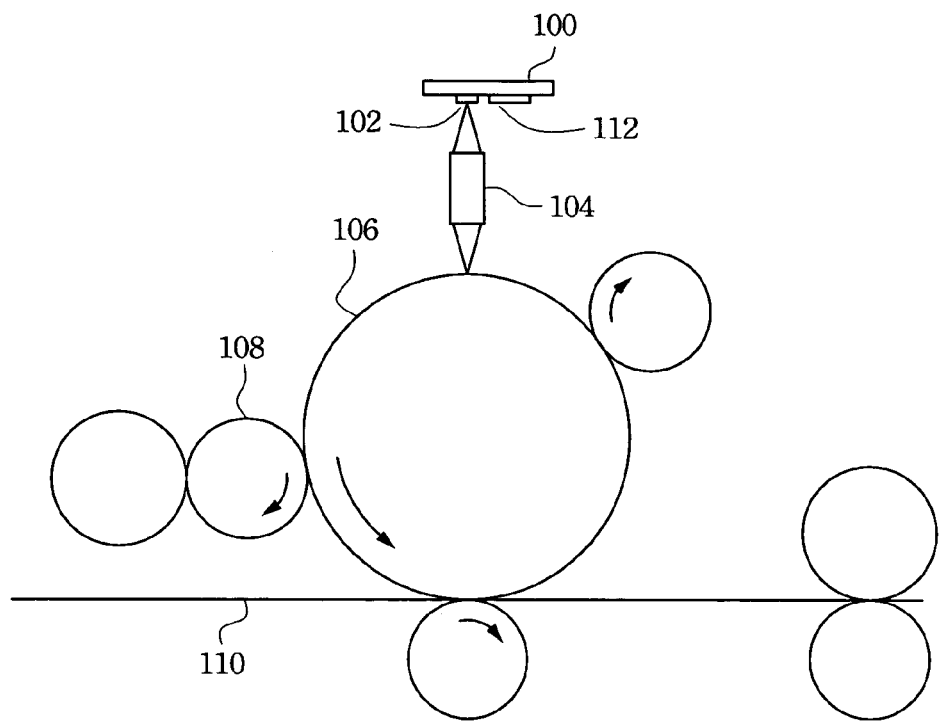
FIG. 1 is a schematic diagram of a conventional printer head.
Figure 2:
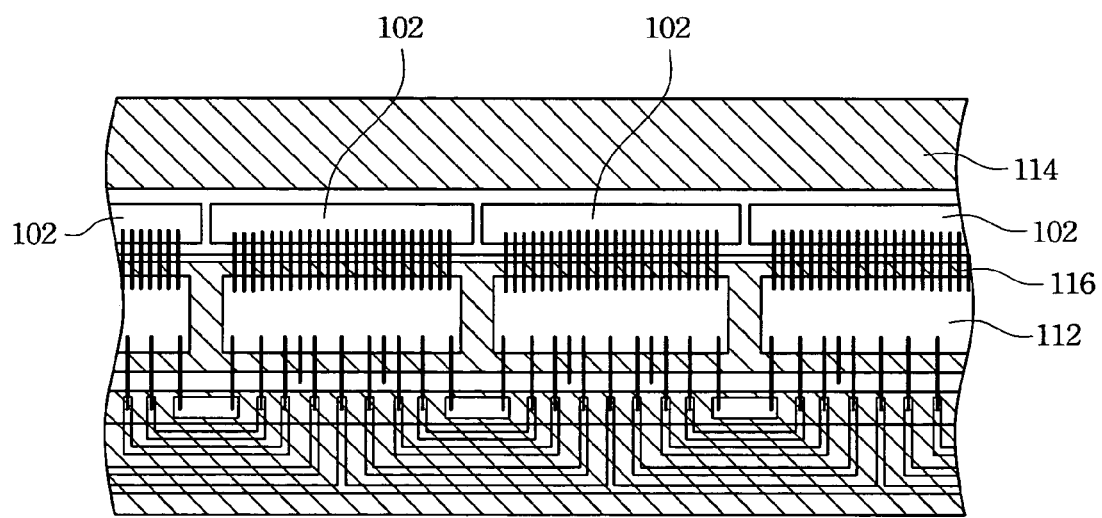
FIG. 2 is a schematic diagram of a constructing method for a conventional printer head.
Figure 3A:
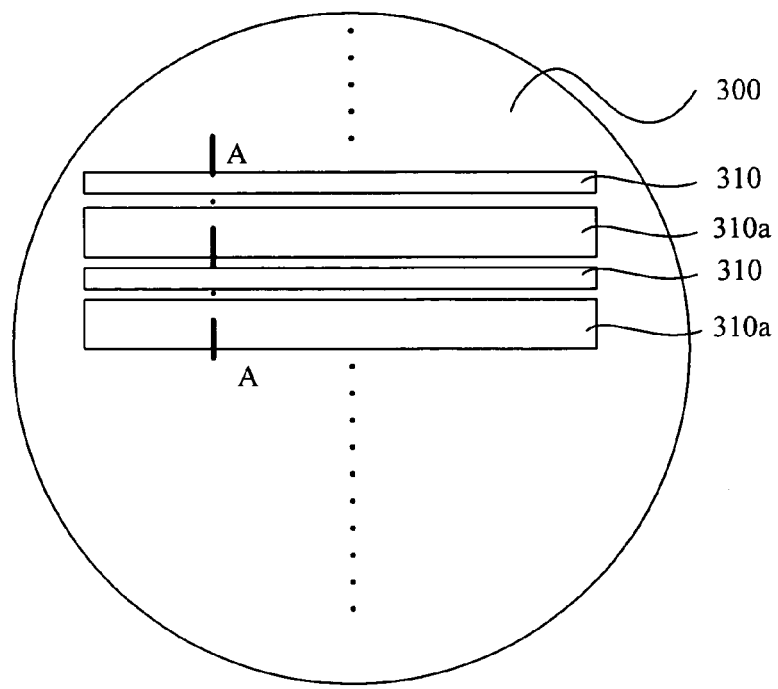
FIG. 3A is a schematic diagram of a substrate with a trench structure according to the preferred embodiment of the present invention.
Figure 3B:
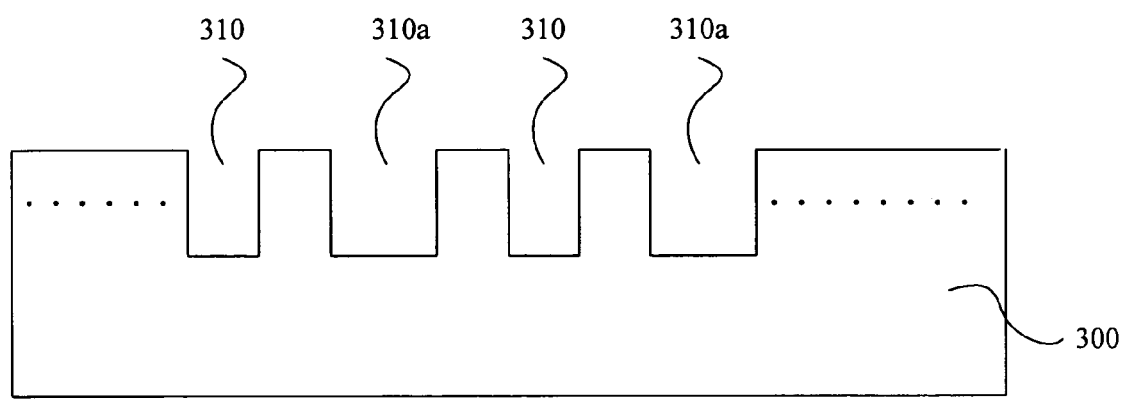
FIG. 3B is a cross-sectional view along the A-A line of FIG. 3A.

FIG. 3A is a schematic diagram of a substrate with light emitting diode arrays and driver integrated circuits formed thereon. According to the preferred embodiment of the present invention, a well-known etching process is performed to form trenches 310 and 310a over a substrate 300, such as a silicon wafer. The trenches 310 are used to house the light emitting diode arrays 302. The trenches 310a are used to house the driver integrated circuits 304. The depth and size of the trenches 310 and 310a suit the corresponding light emitting diode arrays 302 and the driver integrated circuits 304. FIG. 3B is a cross-sectional view along the A-A line in FIG. 3A. A well-known method, such as dry etching or machining, is used to form the trenches 310 and 310a in the substrate 300. However, other processing methods that may form trenches in a substrate may also be used in the present invention. The depth and size of the trenches are adjusted to fit the corresponding light emitting diode arrays 302 or the driver integrated circuits 304.

Figure 4A:
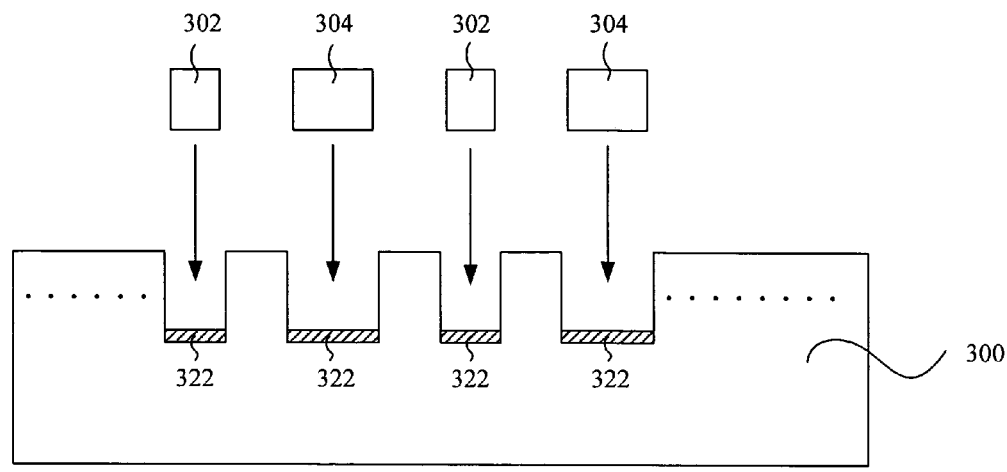
FIG. 4A is an embodiment of the present invention, in which a light emitting diode array and a driver integrated circuit are placed in a substrate.
Figure 4B:
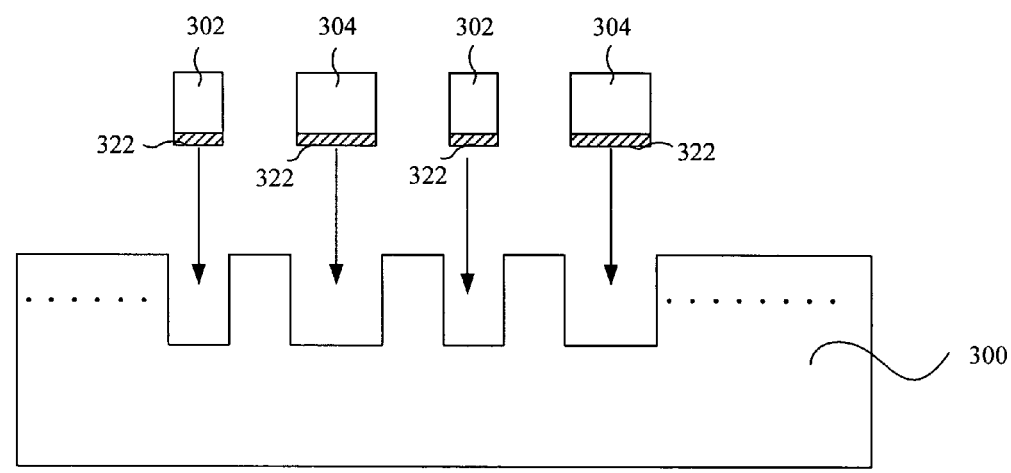
FIG. 4B is another embodiment of the present invention, in which a light emitting diode array and a driver integrated circuit are placed in a substrate.
Figure 4C:
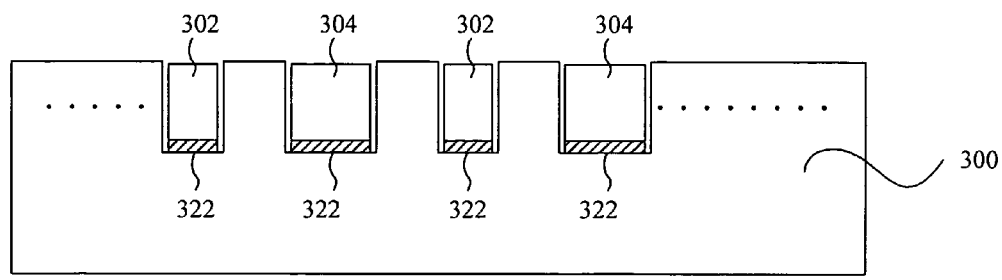
FIG. 4C is a schematic diagram, in which a light emitting diode array and a driver integrated circuit are placed in trenches of a substrate.

Referring to FIG. 4A, after the trenches 310 and 310a are formed in the substrate 300, adhering means 322 are coated on the bottom of the trenches 310 and 310a so as to adhere the light emitting diode arrays 302 and the driver integrated circuits 304. The adhering means 322 are silver glue or polymide well known in semiconductor technology. The coating method is spin coating or stamping. Then, the LED arrays 302 and the driver integrated circuits 304 are adhered to the corresponding trenches 310 and 310a. Referring to FIG. 4B, representing another embodiment, the adhering means 322 are coated on the bottom of the light emitting diode arrays 302 and the driver integrated circuits 304 first. Then, the LED arrays 302 and the driver integrated circuits 304 are adhered to the corresponding trenches 310. FIG. 4C is a schematic diagram, in which the LED arrays 302 and the driver integrated circuits 304 are placed in the corresponding trenches 310 and 310a.

Next, a photolithography process forms the electrical connection between the pins 317b of the light emitting diode arrays and the pins 317a of the driver integrated circuits 304. The foregoing embodiment involves forming the electrical connections. However, the present invention can also use other methods to form the electrical connections.

The constructing method of the present invention can be applied to different specification light emitting diode arrays and driver integrated circuits. FIGS. 5A to 5F are the process diagrams according to the first embodiment of the present invention. The symmetrical light emitting diode arrays 302 and the symmetrical driver integrated circuits 304 are used in this embodiment as shown in FIG. 5E.

Figure 5A:
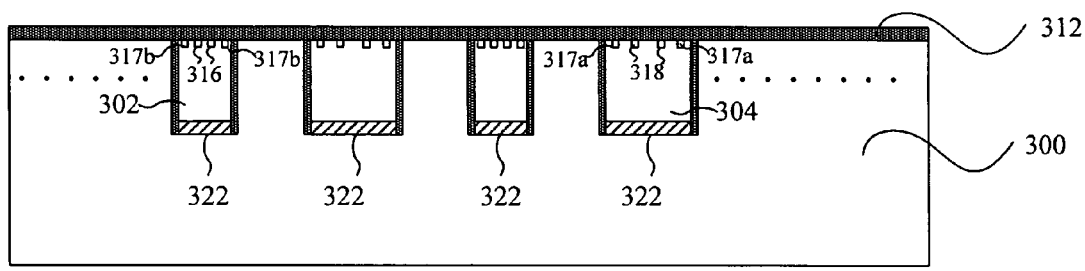
FIG. 5A is a schematic diagram of the first embodiment of the present invention, in which an insulation layer is formed over a substrate, light emitting diode arrays and driver integrated circuits.

As shown in FIG. 5A, according to the preferred embodiment, a well-known method is used to deposit an insulating layer 312 over the substrate 300, the light emitting diode arrays 302 and the driver integrated circuits 304. The material of the insulating layer 312, for example, is a polymide. The deposition method, for example, is a spin-coating method. Next, a well-known planarization process is performed to planarize the insulating layer 312. For example, the planarized surface may be obtained by heating and flowing the insulating layer 312.

Figure 5B:
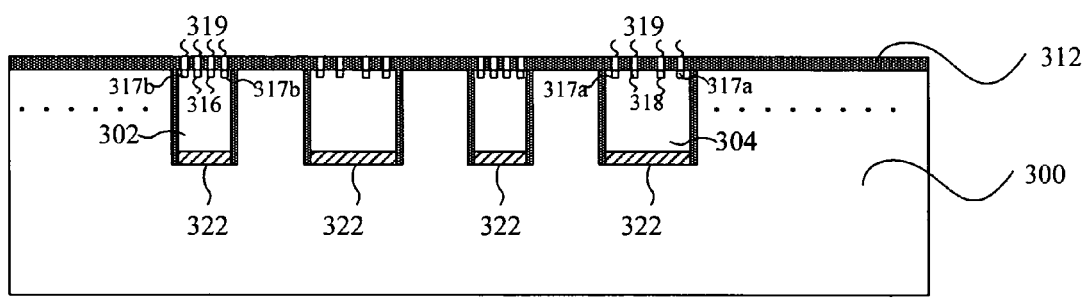
FIG. 5B is a schematic diagram of the first embodiment of the present invention, in which the insulation layer is etched to form a contact hole to expose the pins of the light emitting diode arrays and driver integrated circuits.

Referring to FIG. 5B, a photolithography process is performed in the insulating layer 312 after the planarization process is finished to expose the pins 317b of the light emitting diode arrays and the pins 317a and 318 of the driver integrated circuits 304. The pins 318 are the pins for connecting to the power source. First, a photoresist layer, not shown in FIG. 5B, is formed over the insulating layer 312. Next, this photoresist layer is patterned. Then, using the patterned photoresist layer as a mask, the insulating layer 312 is etched to form contact windows 319 therein to expose the pins of the light emitting diode arrays and the driver integrated circuits 304. Finally, the photoresist layer is removed. In another embodiment, the photosensitive polymide may be used to expose the pins 317b of the light emitting diode arrays and the pins 317a and 318 of the driver integrated circuits 304 by means of a photolithography process.

Figure 5C:
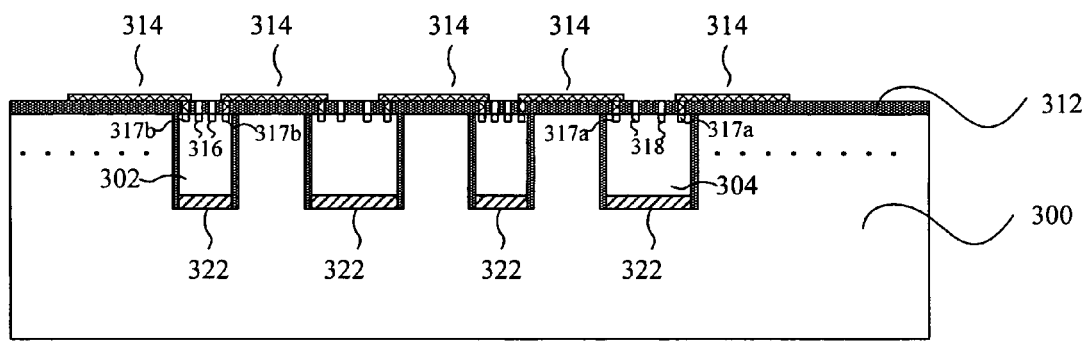
FIG. 5C is a schematic diagram of the first embodiment of the present invention, in which conductive lines are formed between pins of the light emitting diode arrays and driver integrated circuits respectively.

Referring to FIG. 5C, a conductive layer 314 is deposited to fill the contact windows 319. The material of the conductive layer 314 is aluminum (Al) or gold (Au). According to the preferred embodiment of the present invention, the material of the conductive layer 314 is gold. Chemical vapor deposition (CVD), electroplating or electron beam evaporation is used to deposit the conductive layer 314.

Then, a photoresist layer (not shown) is formed over the conductive layer 314. Next, this photoresist layer is patterned to form the conductive line pattern. Using the patterned photoresist layer as a mask, this conductive layer 314 is etched to define the conductive lines between the pins 317b of the light emitting diode arrays 302 and the pins 317a of the driver integrated circuits 304. Finally, the photoresist layer is removed. In another embodiment, a metal lift-off technology may be used to form the conductive lines.

Figure 5D:
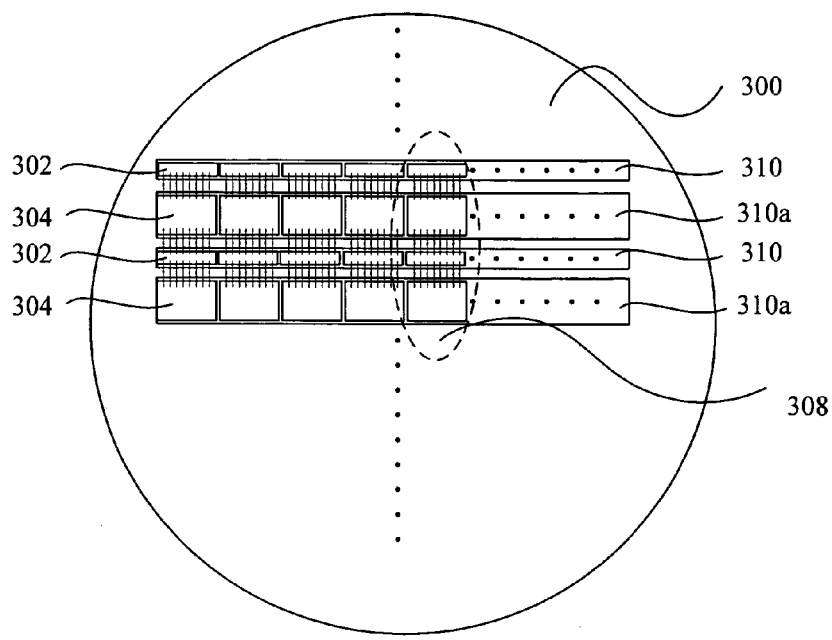
FIG. 5D is a schematic diagram of the first embodiment of the present invention, in which the light emitting diode arrays and driver integrated circuits are placed on a wafer.
Figure 5E:
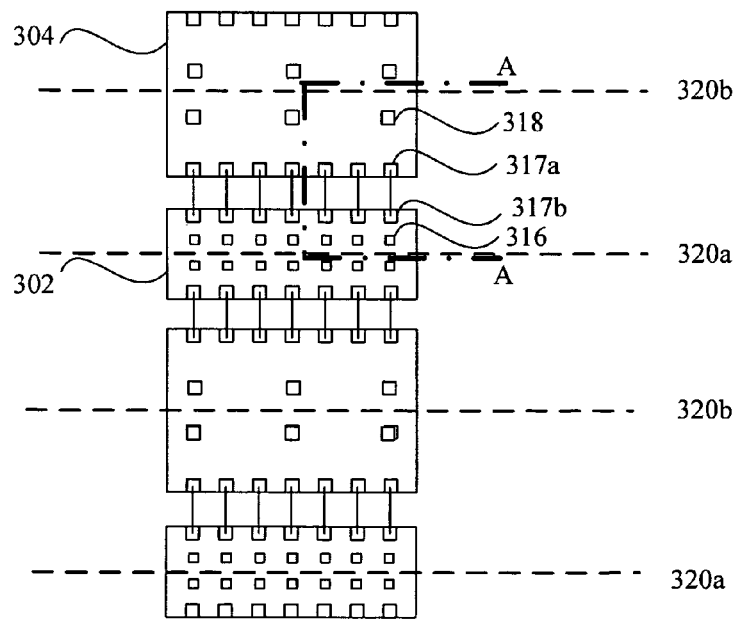
FIG. 5E is an enlarged schematic diagram of the region 308 in FIG. 5D.

FIG. 5D illustrates the arrangement method of the light emitting diode arrays 302 and the driver integrated circuits 304 over the substrate 300 after finishing the foregoing process. FIG. 5E is an enlarged diagram of the region 308 in FIG. 5D. Subsequently, an electrical detection process is performed to find defective light emitting diode arrays 302 and driver integrated circuits 304. The probability of connection failure with the printed circuit board in the foregoing process may be further reduced by this detection process. In other words, according to the present invention, the difficulty and tediousness of the reworking process are reduced because this electrical detection process is performed before joining to the printed circuit board. Moreover, the present invention does not employ the typical wire bonding process between the light emitting diode arrays 302 and the driver integrated circuits 304. Therefore, the manufacturing complexity is reduced. Accordingly, the product yield is raised.

After the conductive lines between the light emitting diode arrays 302 and the driver integrated circuits 304 are created, a die-cutting process forms individual units so as to connect with the printed circuit board.

Figure 5F:
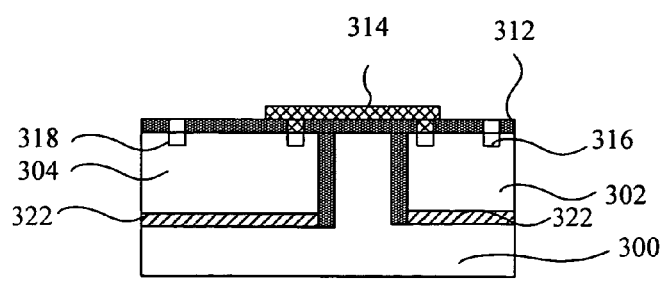
FIG. 5F is a cross-sectional view along the A-A line of FIG. 5E.

According to the first embodiment of the present invention, the cutting direction in the die-cutting process follows the midline 320a in the light emitting diode array 302 and the midline 320b in the driver integrated circuit 304 respectively, producing two individual units as illustrated in FIG. 5F, which is a cross-sectional view along the A-A line in FIG. 5E.

For a constructing unit used in a printer with over 600 dpi resolution, such as 1200 dpi, the light emitting diodes arranged in a light emitting diode array are densest. Therefore, the pins are arranged in two sides of a light emitting diode array and are driven by the driver integrated circuits.

This foregoing driving structure can also employ the constructing method of the present invention.

In the second embodiment, the process steps are similar to the first embodiment and are illustrated in FIGS. 6A to 6F. The main difference between the first and second embodiments is the photolithography process step for forming the conductive line pattern because of using different light emitting diode arrays and driver integrated circuits.

Figure 6A:
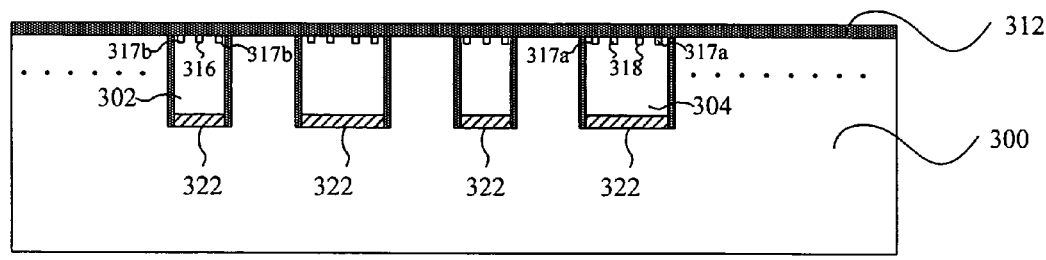
FIG. 6A is a schematic diagram of the second embodiment of the present invention, in which an insulation layer is formed over a substrate, light emitting diode arrays and driver integrated circuits.

FIG. 6A illustrates the step of depositing the insulating layer 312 and the step of planarizing the insulating layer 312.

Figure 6B:
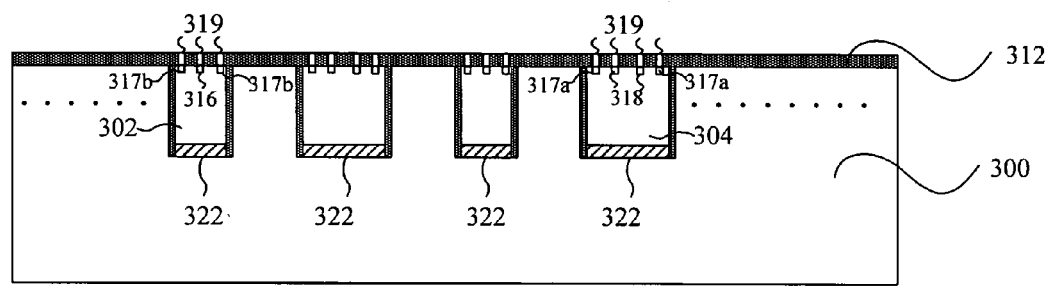
FIG. 6B is a schematic diagram of the second embodiment of the present invention, in which the insulation layer is etched to form a contact hole to expose the pins of the light emitting diode arrays and driver integrated circuits.

Referring to FIG. 6B, a photolithography process is performed in the insulating layer 312 to form contact windows 319 to expose the pins 317b of the light emitting diode arrays 302 and the pins 317a and 318 of the driver integrated circuits 304.

Figure 6C:
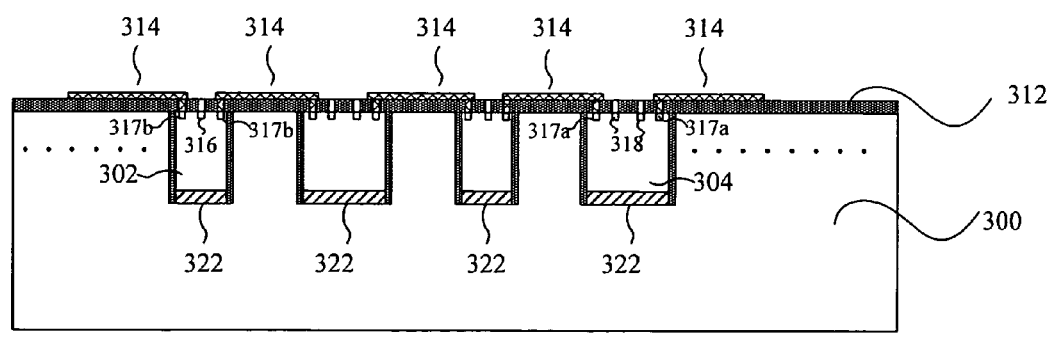
FIG. 6C is a schematic diagram of the second embodiment of the present invention, in which conductive lines are formed between pins of the light emitting diode arrays and driver integrated circuits respectively.

Referring to FIG. 6C, a conductive layer 314 is deposited to fill the contact windows 319. This conductive layer 314 is defined and etched to form the conductive lines between the pins 317b of the light emitting diode arrays 302 and the pins 317a of the driver integrated circuits 304.

Figure 6D:
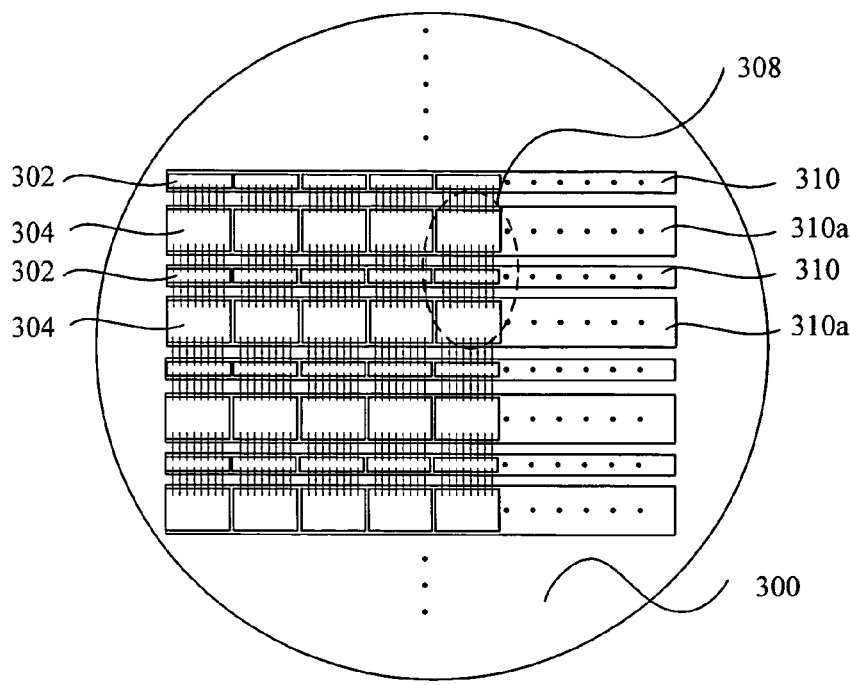
FIG. 6D is a schematic diagram of the second embodiment of the present invention, in which the light emitting diode arrays and driver integrated circuits are placed on a wafer.
Figure 6E:
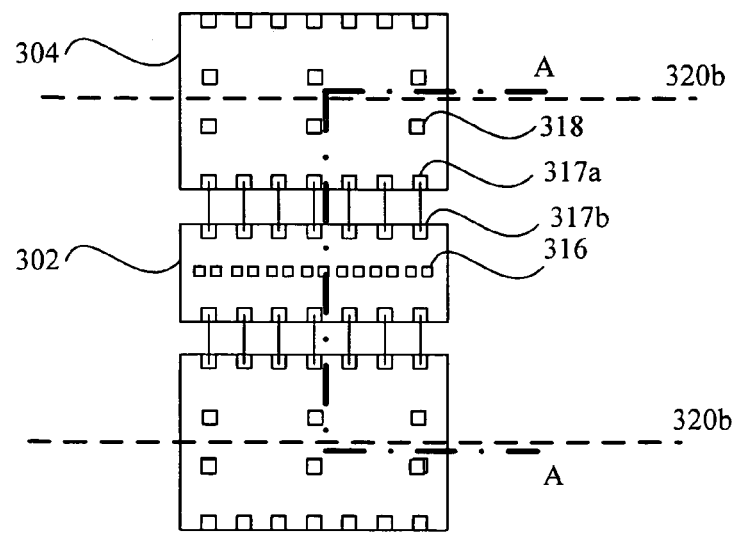
FIG. 6E is an enlarged schematic diagram of the region 308 in FIG. 6D.

FIG. 6D illustrates the arrangement method of the light emitting diode arrays 302 and the driver integrated circuits 304 over the substrate 300 after finishing the foregoing process. FIG. 6E is an enlarged diagram of the region 308 in FIG. 6D.

Figure 6F:
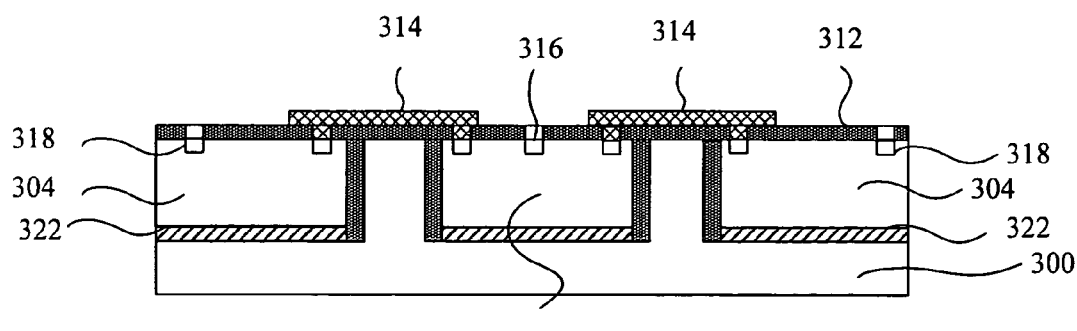
FIG. 6F is a cross-sectional view along the A-A line of FIG. 6E.

According to this second embodiment of the present invention, the cutting direction in the die-cutting process follows the midline 320b in the driver integrated circuit 304, producing one individual unit as illustrated in FIG. 6F, which is a cross-sectional view along the A-A line in FIG. 6E.

Driver integrated circuits with connected pins arranged in one side and light emitting diode arrays with symmetrically arranged light emmiting diodes are used in the third embodiment of the present invention. The process steps are illustrated in FIGS. 7A to 7F.

Figure 7A:
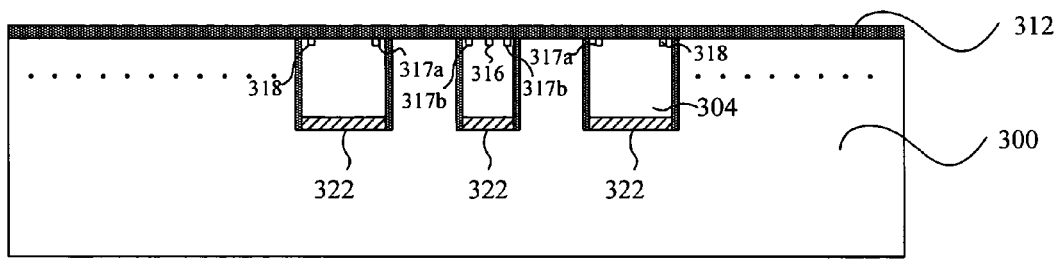
FIG. 7A is a schematic diagram of the third embodiment of the present invention, in which an insulation layer is formed over a substrate, light emitting diode arrays and driver integrated circuits.

FIG. 7A illustrates the steps of depositing the insulating layer 312 and planarizing the insulating layer 312.

Figure 7B:
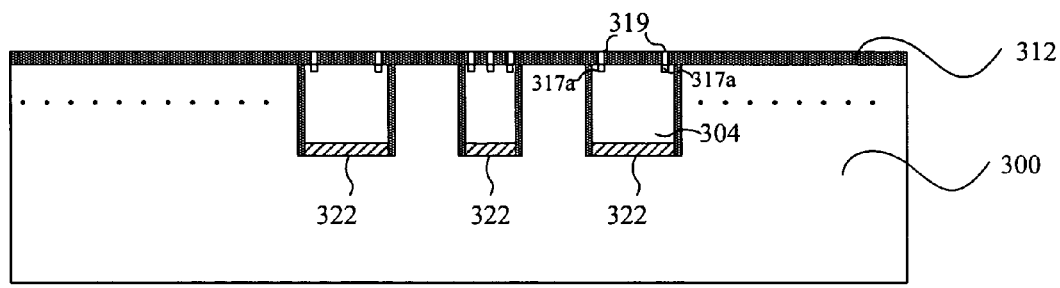
FIG. 7B is a schematic diagram of the third embodiment of the present invention, in which the insulation layer is etched to form a contact hole to expose the pins of the light emitting diode arrays and driver integrated circuits.

Referring to FIG. 7B, a photolithography process is performed in the insulating layer 312 to form contact windows 319 to expose the pins 317b of the light emitting diode arrays 302 and the pins 317a and 318 of the driver integrated circuits 304.

Figure 7C:
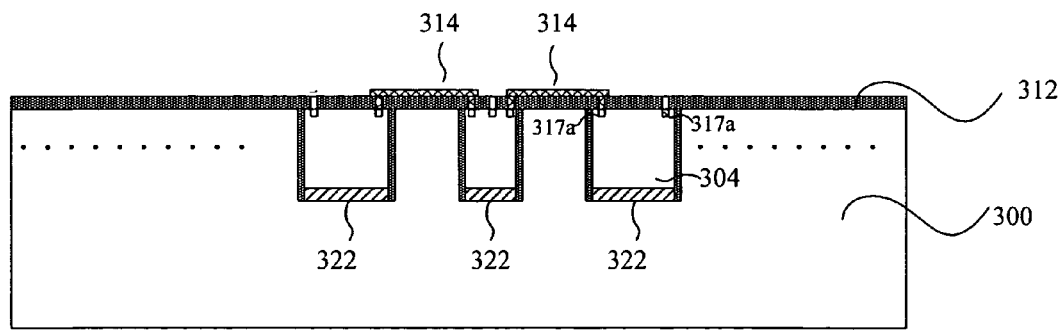
FIG. 7C is a schematic diagram of the third embodiment of the present invention, in which conductive lines are formed between pins of the light emitting diode arrays and driver integrated circuits respectively.

Then, referring to FIG. 7C, a conductive layer 314 is deposited to fill the contact windows 319. This conductive layer 314 is defined and etched to form the conductive lines between the pins 317b of the light emitting diode arrays 302 and the pins 317a of the driver integrated circuits 304.

Figure 7D:
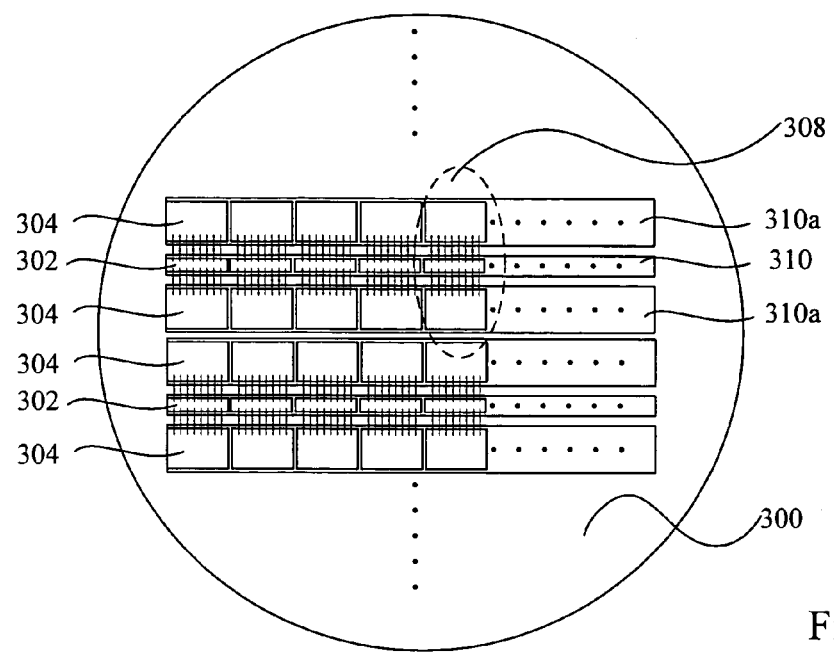
FIG. 7D is a schematic diagram of the third embodiment of the present invention, in which the light emitting diode arrays and driver integrated circuits are placed on a wafer.
Figure 7E:
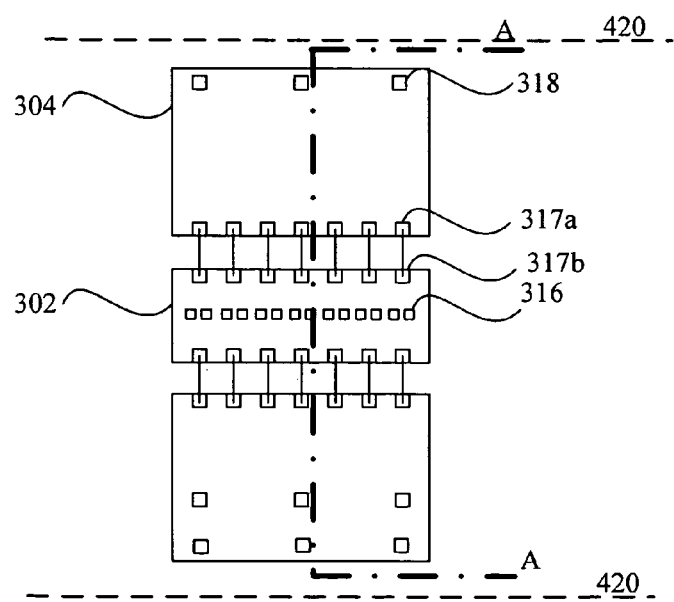
FIG. 7E is an enlarged schematic diagram of the region 308 in FIG. 7D.

FIG. 7D illustrates the arrangement method of the light emitting diode arrays 302 and the driver integrated circuits 304 over the substrate 300 after finishing the foregoing process. FIG. 7E is an enlarged diagram of the region 308 in FIG. 7D.

Figure 7F:
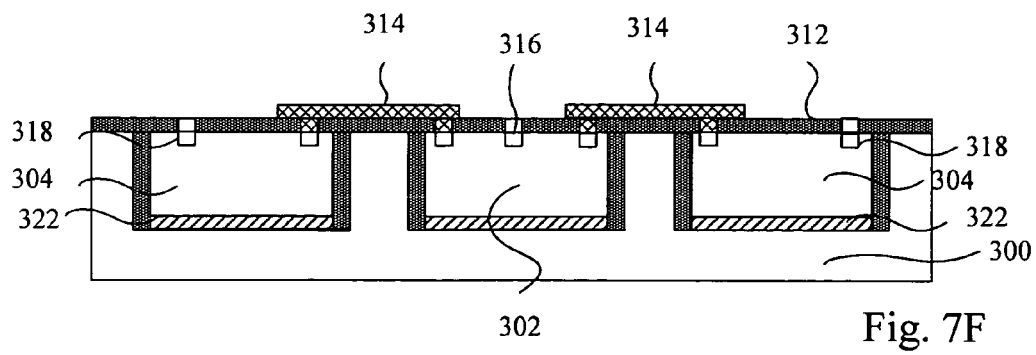
FIG. 7F is a cross-sectional view along the A-A line of FIG. 7E.

According to this third embodiment of the present invention, the cutting direction in the die-cutting process follows the midline 420 on the substrate between the driver integrated circuit 304, producing one individual unit as illustrated in FIG. 7F, which is a cross-sectional view along the A-A line in FIG. 7E.

Driver integrated circuits with connected pins arranged in one side and light emitting diode arrays with light emitting diodes arranged in one side are used in the fourth embodiment of the present invention. FIGS. 8A to 8F illustrate the process steps.

Figure 8A:
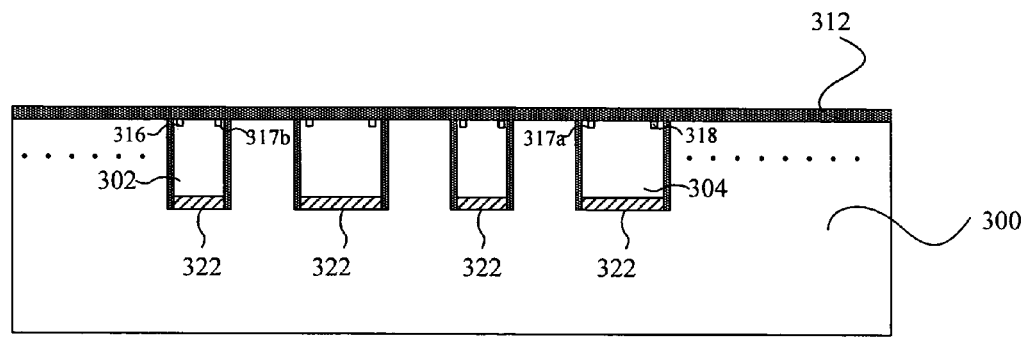
FIG. 8A is a schematic diagram of the fourth embodiment of the present invention, in which an insulation layer is formed over a substrate, light emitting diode arrays and driver integrated circuits.

FIG. 8A illustrates the steps of depositing the insulating layer 312 and planarizing the insulating layer 312.

Figure 8B:
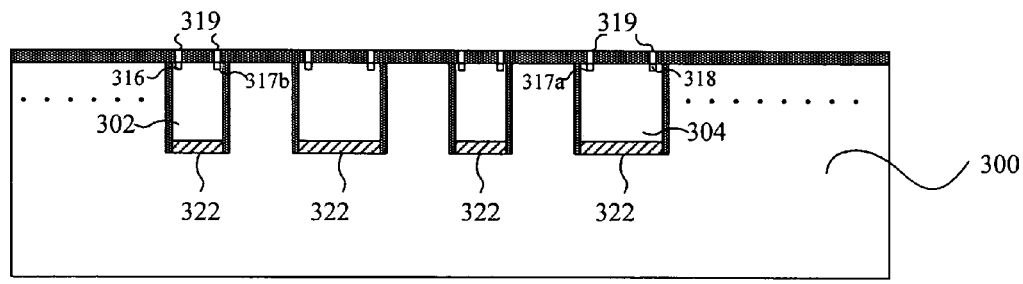
FIG. 8B is a schematic diagram of the fourth embodiment of the present invention, in which the insulation layer is etched to form a contact hole to expose the pins of the light emitting diode arrays and driver integrated circuits.

Referring to FIG. 8B, a photolithography process is performed in the insulating layer 312 to form contact windows 319 to expose the pins 317b of the light emitting diode arrays 302 and the pins 317a and 318 of the driver integrated circuits 304.

Figure 8C:
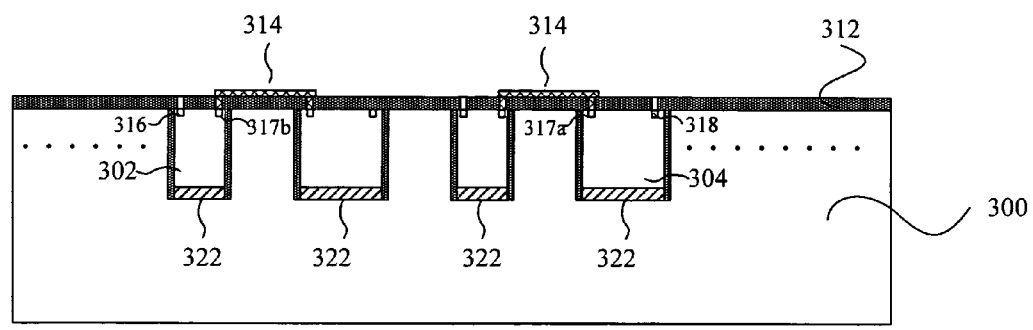
FIG. 8C is a schematic diagram of the fourth embodiment of the present invention, in which conductive lines are formed between pins of the light emitting diode arrays and driver integrated circuits respectively.

Then, referring to FIG. 8C, a conductive layer 314 is deposited to fill the contact windows 319. This conductive layer 314 is defined and etched to form the conductive lines between the pins 317b of the light emitting diode arrays 302 and the pins 317a of the driver integrated circuits 304.

Figure 8D:
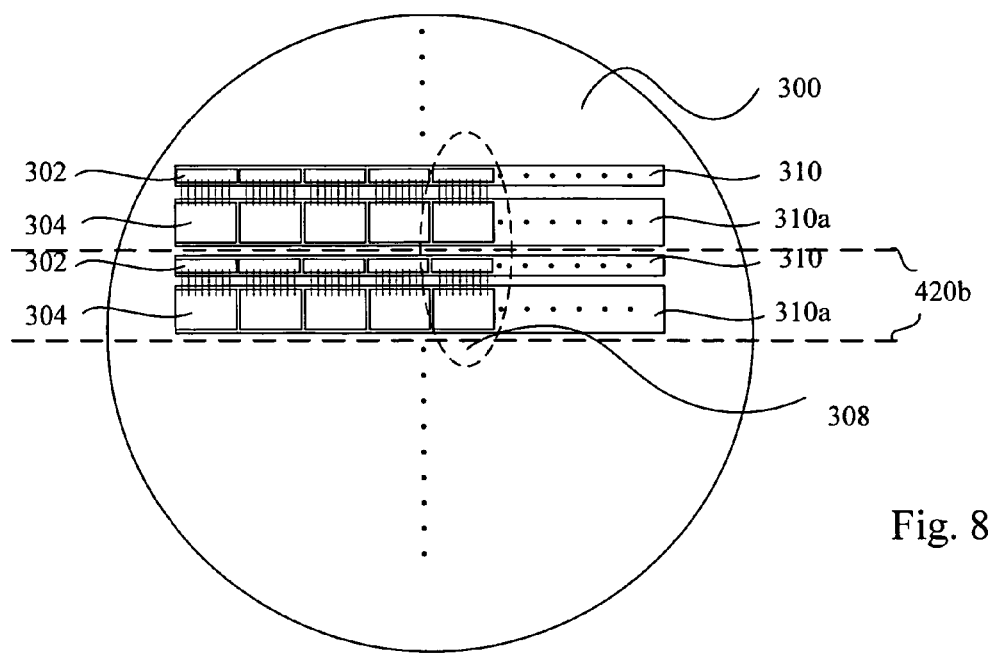
FIG. 8D is a schematic diagram of the fourth embodiment of the present invention, in which the light emitting diode arrays and driver integrated circuits are placed on a wafer.
Figure 8E:
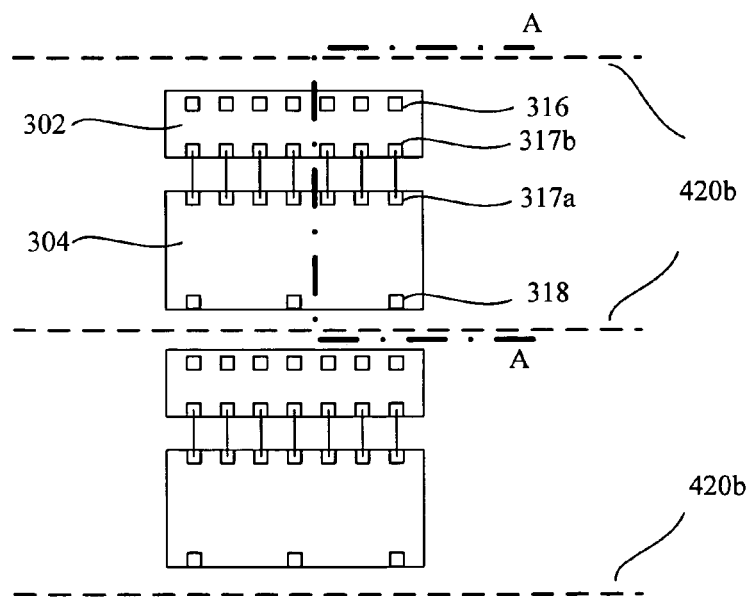
FIG. 8E is an enlarged schematic diagram of the region 308 in FIG. 8D.

FIG. 8D illustrates the arrangement method of the light emitting diode arrays 302 and the driver integrated circuits 304 over the substrate 300 after finishing the foregoing process. FIG. 8E is an enlarged diagram of the region 308 in FIG. 8D.

Figure 8F:
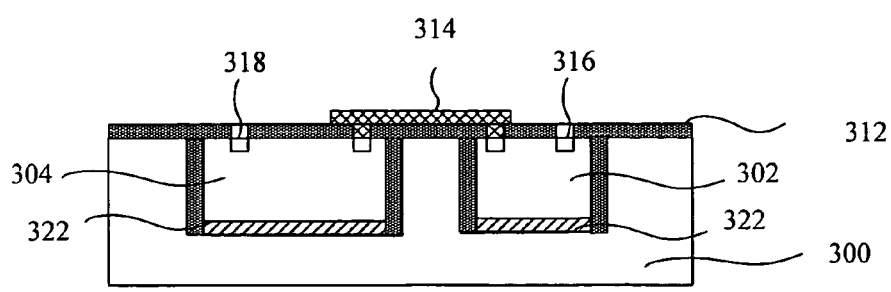
FIG. 8F is a cross-sectional view along the A-A line of FIG. 8E.

According to this fourth embodiment of the present invention, the cutting direction in the die-cutting process follows the midline 420b on the substrate between the driver integrated circuit 304 and the light emitting diode array 302, producing one individual unit as illustrated in FIG. 8F, which is a cross-sectional view along the A-A line in FIG. 8E.

Figure 9A:
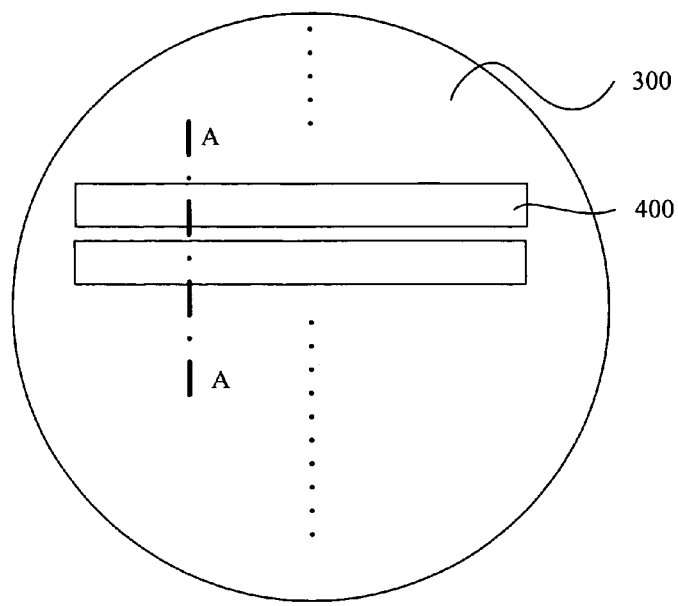
FIG. 9A is a schematic diagram of a substrate with a trench structure according to another preferred embodiment of the present invention.
Figure 9B:
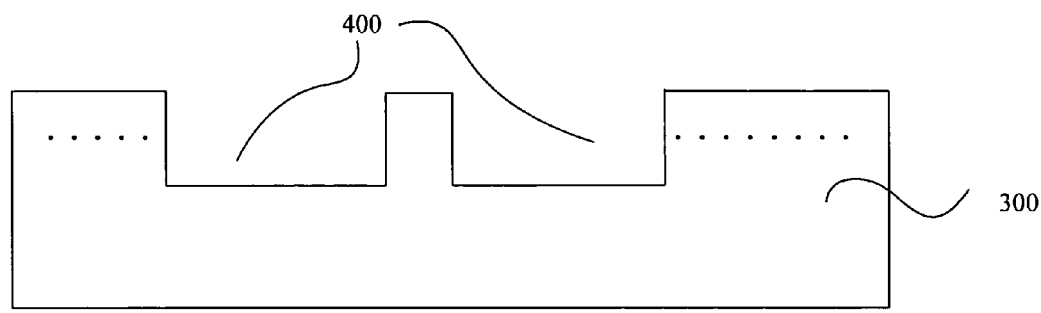
FIG. 9B is a cross-sectional view along the A-A line of FIG. 9A.
Figure 9C:
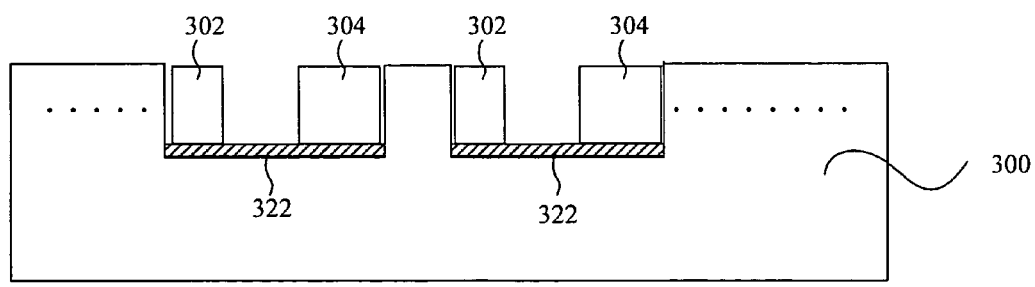
FIG. 9C is a schematic diagram, in which a light emitting diode array and a driver integrated circuit are placed in trenches of a substrate.

In contrast, driver integrated circuits with connected pins arranged in one side and light emitting diode arrays with light emitting diodes arranged in one side are used in the fifth embodiment of the present invention. In FIG. 9A, trench structures 400 are formed in a semiconductor wafer 300. FIG. 9B is a cross-sectional view along the A-A line of FIG. 9A. After the trench structures are formed, a light emitting diode array 302 and a driver integrated circuit 304 are placed in the trenches and near the wall of the trenches 400, as shown in FIG. 9C.

Figure 10A:
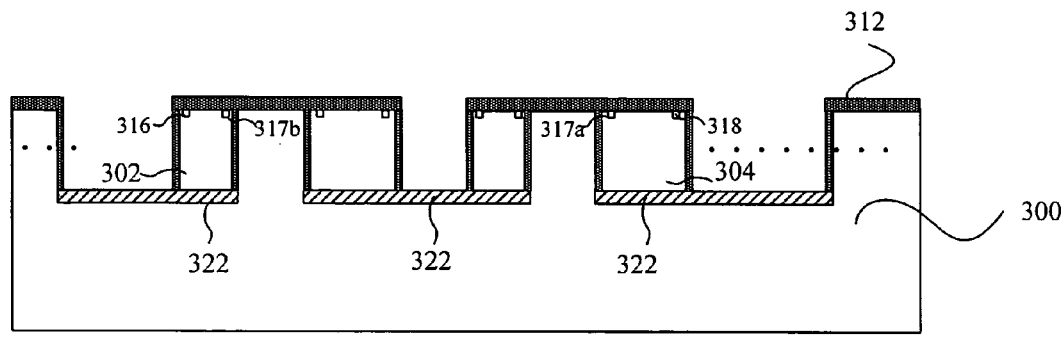
FIG. 10A is a schematic diagram of the fifth embodiment of the present invention, in which an insulation layer is formed over a substrate, light emitting diode arrays and driver integrated circuits.
Figure 10B:
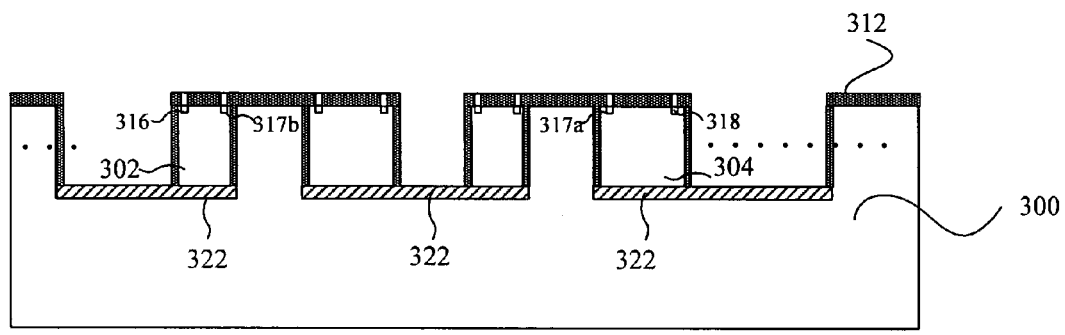
FIG. 10B is a schematic diagram of the fifth embodiment of the present invention, in which the insulation layer is etched to form a contact hole to expose the pins of the light emitting diode arrays and driver integrated circuits.

Next, the insulating layer 312 is deposited and planarized, as shown in FIG. 10A.

Figure 10C:
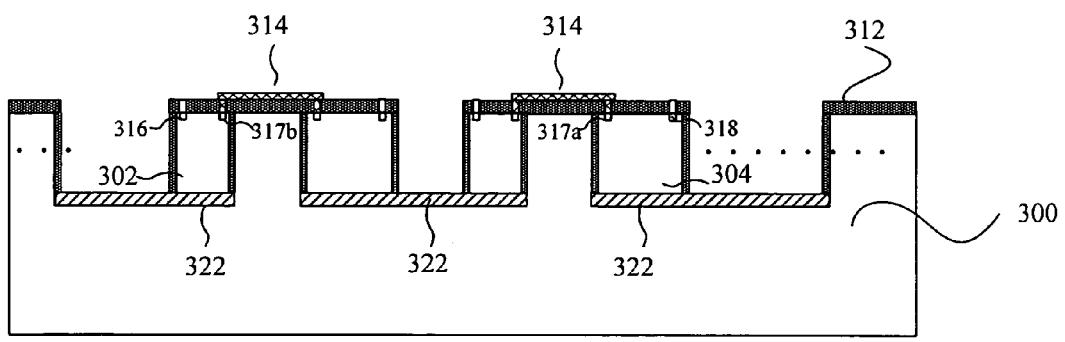
FIG. 10C is a schematic diagram of the fifth embodiment of the present invention, in which conductive lines are formed between pins of the light emitting diode arrays and driver integrated circuits respectively.

Then, referring to FIG. 10C, a conductive layer 314 is deposited to fill the contact windows 319. This conductive layer 314 is defined and etched to form the conductive lines between the pins 317b of the light emitting diode arrays 302 and the pins 317a of the driver integrated circuits 304.

Figure 10D:
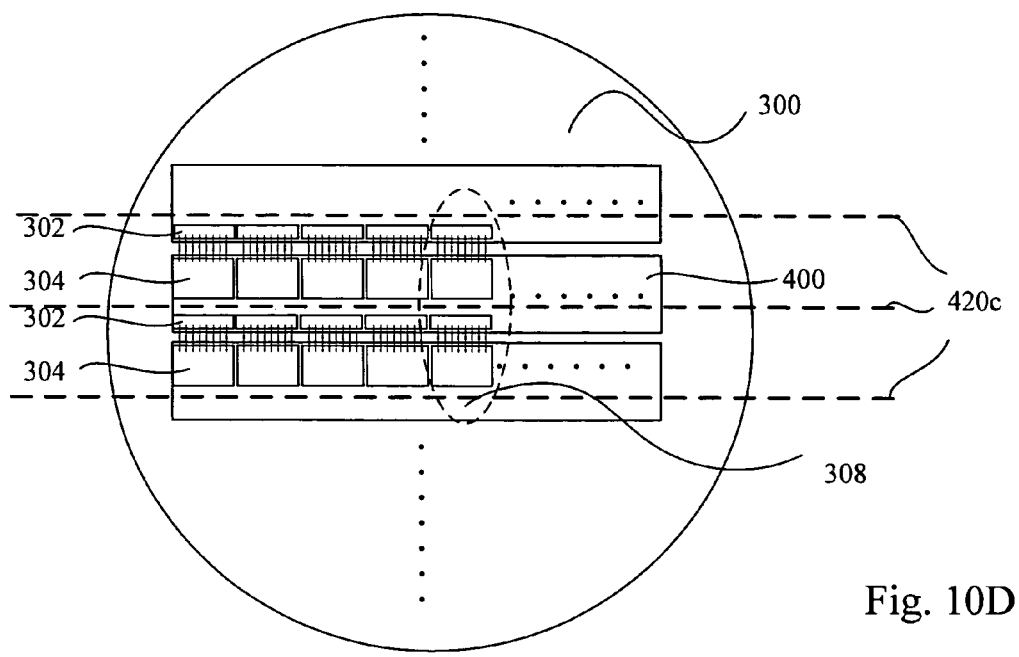
FIG. 10D is a schematic diagram of the fifth embodiment of the present invention, in which the light emitting diode arrays-and driver integrated circuits are placed on a wafer.
Figure 10E:
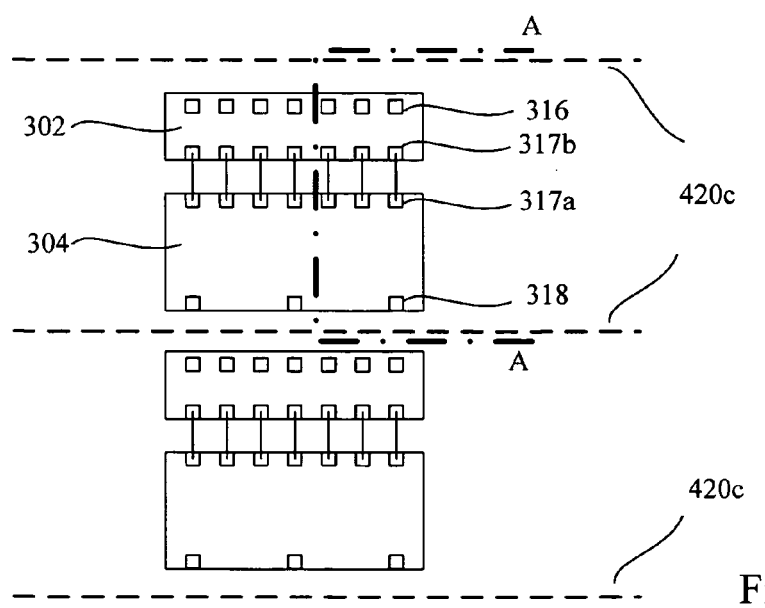
FIG. 10E is an enlarged schematic diagram of the region 308 in FIG. 10D.

FIG. 10D illustrates the arrangement method of the light emitting diode arrays 302 and the driver integrated circuits 304 over the substrate 300 after finishing the foregoing process. FIG. 10E is an enlarged diagram of the region 308 in FIG. 10D.

Figure 10F:
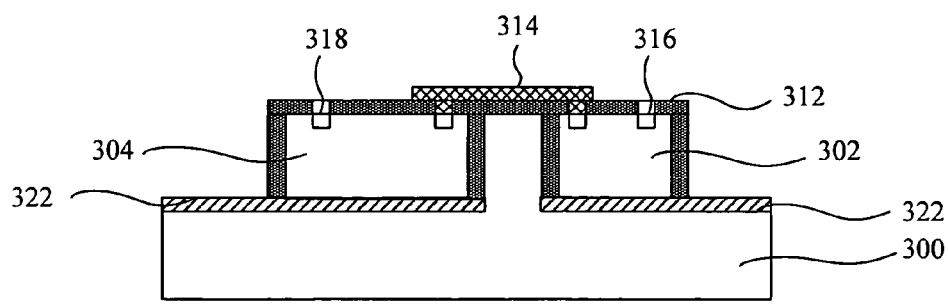
FIG. 10F is a cross-sectional view along the A-A line of FIG. 10E.
Figure 11A:
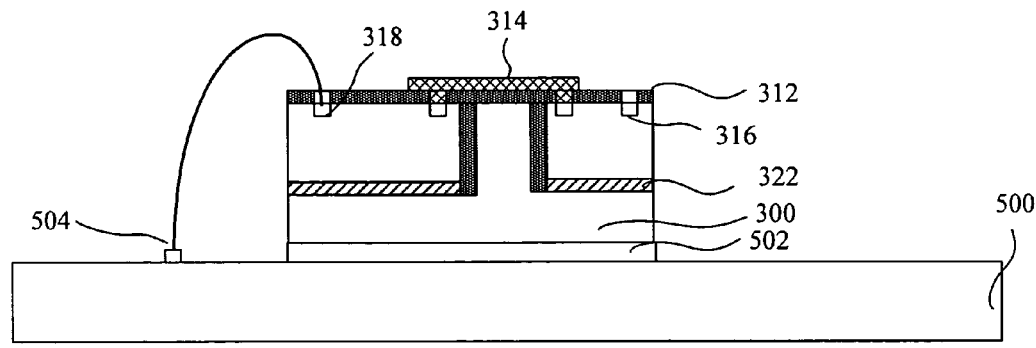
FIG. 11A is a schematic diagram of a printer head according to the first embodiment of the present invention.
Figure 11B:
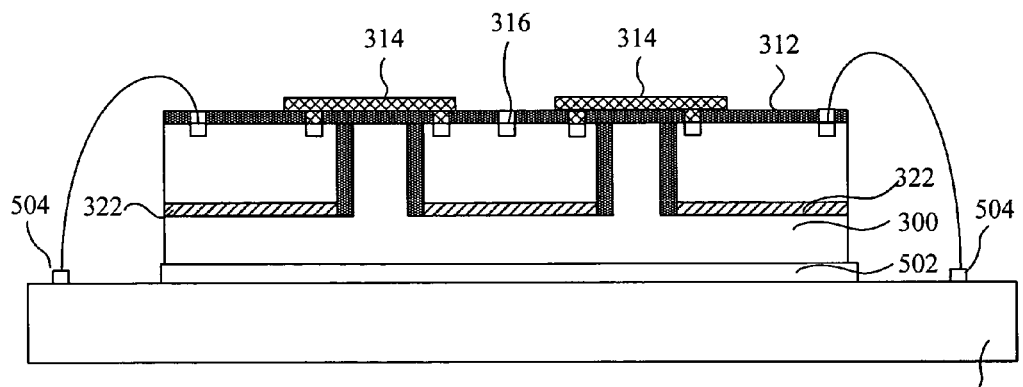
FIG. 11B is a schematic diagram of a printer head according to the second embodiment of the present invention.
Figure 11C:
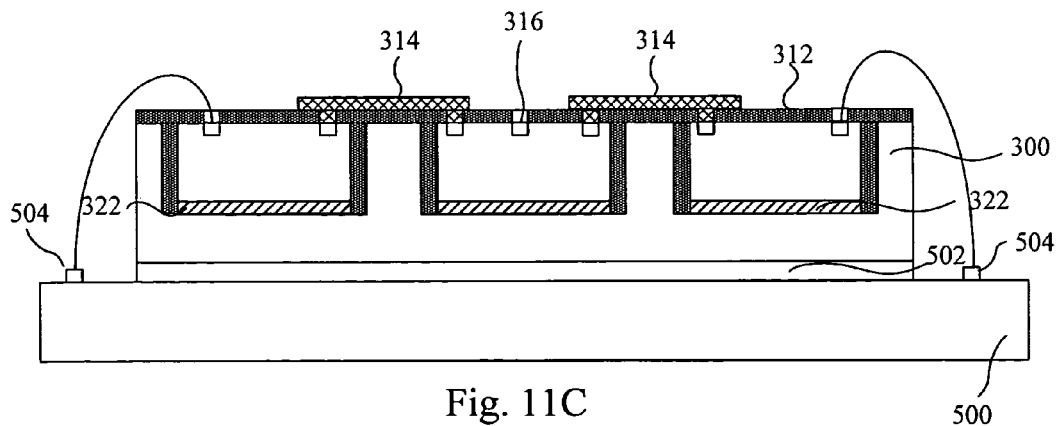
FIG. 11C is a schematic diagram of a printer head according to the third embodiment of the present invention.
Figure 11D:
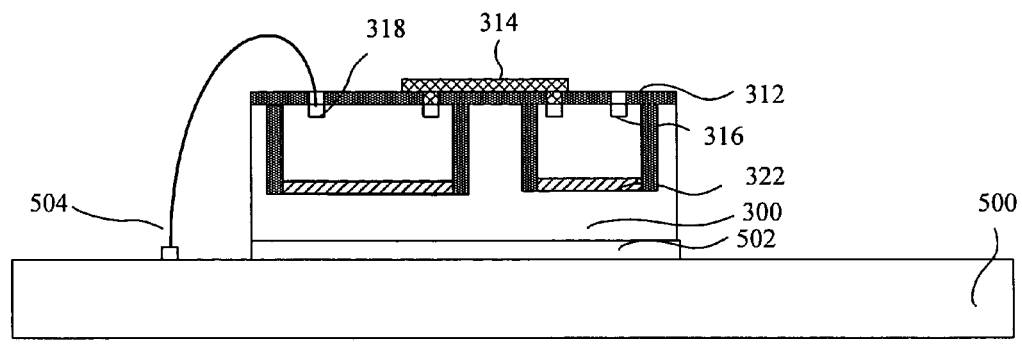
FIG. 11D is a schematic diagram of a printer head according to the fourth embodiment of the present invention.
Figure 11E:
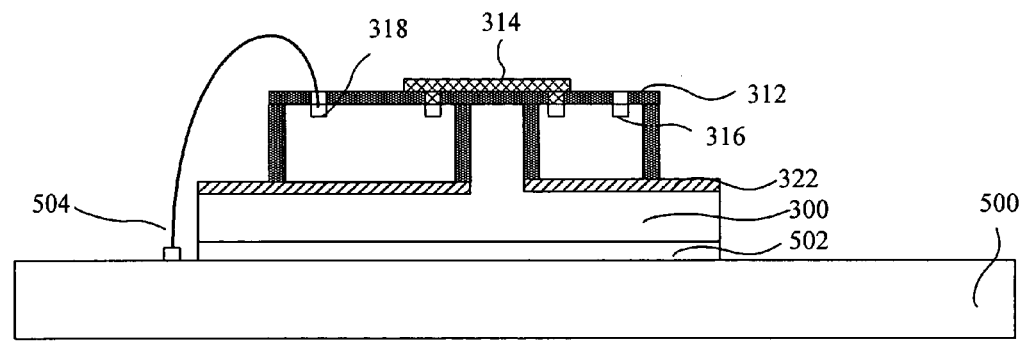
FIG. 11E is a schematic diagram of a printer head according to the fifth embodiment of the present invention.

According to this fifth embodiment of the present invention, the cutting direction in the die-cutting process follows the midline 420c in the trench between the driver integrated circuit 304 and the light emitting diode array 302, producing one individual unit as illustrated in FIG. 10F, which is a cross-sectional view along the A-A line in FIG. 10E.

FIGS. 11A to 11E respectively illustrate a constructing unit used in a printer head. In accordance with the preferred embodiment, the constructing unit may be adhered to a printed circuit board 500 through a adhering means 502. A wire bonding process forms an electrical connection between the pins 318 of the driver integrated circuit 304 and the input/output pins 504 of the printed circuit board 500.

According to the method, the light emitting diode arrays and the driver integrated circuits are located in the substrate first. Next, a photolithography process forms electrical connections between them. Finally, a die-cutting process generates individual units. Compared with the conventional wire bonding method, the photolithography process can mass-produce the electrical connections to increase the production throughput. Moreover, the electrical connection process is followed by the electrical detection process. Therefore, a defective product can be found and replaced in real time to reduce reworking waste. Accordingly, the present invention may increase production efficiency and product yield.

As is understood by a person skilled in the art, the foregoing descriptions of the preferred embodiments of the present invention are illustrations of the present invention rather than limitations thereof. Various modifications and similar arrangements are included within the spirit and scope of the appended claims. The scope of the claims should be accorded to the broadest interpretation so as to encompass all such modifications and similar structures. While preferred embodiments of the invention have been illustrated and described, it will be appreciated that various changes can be made therein without departing from the spirit and scope of the invention.

What is claimed is:

1. A light emitting diode array package structure, said structure comprising: a substrate with a plurality of trenches; at least one light emitting diode array with at least one pin located in a corresponding trench; at least one driver integrated circuit with at least one pin located in a corresponding trench; and a first conductive connection structure located between said pins of said at least one light emitting diode array and said at least one driver integrated circuit for providing electrical connectivity.

2. The structure of claim 1, wherein said structure further comprises a printed circuit board with at least one input/output pin.

3. The structure of claim 2, wherein said structure further comprises a second conductive connection structure located between said at least one driver integrated circuit and said at least one input/output pin.

4. The structure of claim 3, wherein said second conductive connection structure is formed by a wire bonding method.

5. The structure of claim 1, wherein said structure further comprises an insulating layer formed over said substrate, said light emitting diode array and said driver integrated circuit.

6. The structure of claim 5, wherein said first conductive connection structure is formed by a photolithography process.

7. The structure of claim 6, wherein said photolithography process comprises: patterning said insulating layer to expose pins of said at least one light emitting diode array and said at least one driver integrated circuit; forming a conductive layer over said insulating layer; and patterning said conductive layer to form an electrical connection between said pins of said at least one light emitting diode array and said at least one driver integrated circuit.

8. The structure of claim 7, wherein the material for forming said conductive layer is Au or Al.

9. The structure of claim 1, wherein said at least one light emitting diode array has symmetrically arranged light emitting diodes.

10. The structure of claim 9, wherein a cutting direction when performing a die-cutting process follows a midline of said light emitting diode array and said driver integrated circuit.

11. The structure of claim 1, wherein said at least one driver integrated circuit has symmetrically arranged pins.

12. The structure of claim 11, wherein a cutting direction when performing a die-cutting process follows a midline of said driver integrated circuit.

13. The structure of claim 1, wherein said at least one light emitting diode array has symmetrically arranged pins, and said driver integrated circuit has pins arranged on one side.

14. The structure of claim 13, wherein a cutting direction when performing a die-cutting process follows a midline of said driver integrated circuit.

15. The structure of claim 1, wherein said at least one light emitting diode array has pins arranged on one side and light emitting diodes arranged on one side, and said driver integrated circuit has pins arranged on one side.

16. The structure of claim 15, wherein a cutting direction when performing a die-cutting process follows a midline on the substrate between said driver integrated circuit and said at least one light emitting diode array.

17. A light emitting diode array package structure used in a printer head, said structure comprising: a substrate with a plurality of trenches; at least one light emitting diode array with at least one pin located in a corresponding trench; at least one driver integrated circuit with at least one pin located in a corresponding trench; a first conductive connection structure located between said pins of said at least one light emitting diode array and said at least one driver integrated circuit for providing electrical connectivity; a printed circuit board with at least one input/output pin, wherein said substrate is located over said printed circuit board; and a second conductive connection structure located between said at least one driver integrated circuit and said at least one input/output pin.

18. The structure of claim 17, wherein said second conductive connection structure is formed by a wire bonding method.

19. The structure of claim 17, wherein said structure further comprises an insulating layer formed over said substrate, said light emitting diode array and said driver integrated circuit.

20. The structure of claim 19, wherein said first conductive connection structure is formed by a photolithography process.

21. The structure of claim 20, wherein said photolithography process comprises: patterning said insulating layer to expose pins of said at least one light emitting diode array and said at least one driver integrated circuit; forming a conductive layer over said insulating layer; and patterning said conductive layer to form an electrical connection between said pins of said at least one light emitting diode array and said at least one driver integrated circuit.

22. The structure of claim 21, wherein the material for forming said conductive layer is Au or Al.

23. The structure of claim 17, wherein said at least one light emitting diode array has symmetrically arranged light emitting diodes.

24. The structure of claim 23, wherein a cutting direction when performing a die-cutting process follows a midline of said light emitting diode array and said driver integrated circuit.

25. The structure of claim 17, wherein said at least one driver integrated circuit has symmetrically arranged pins.

26. The structure of claim 25, wherein a cutting direction when performing a die-cutting process follows a midline of said driver integrated circuit.

27. The structure of claim 17, wherein said at least one light emitting diode array has symmetrically arranged pins, and said driver integrated circuit has pins arranged on one side.

28. The structure of claim 27, wherein a cutting direction when performing a die-cutting process follows a midline of said driver integrated circuit.

29. The structure of claim 17, wherein said at least one light emitting diode array has pins arranged on one side and light emitting diodes arranged on one side, and said driver integrated circuit has pins arranged on one side.

30. The structure of claim 29, wherein a cutting direction when performing a die-cutting process follows a midline on the substrate between said driver integrated circuit and said at least one light emitting diode array.

* * * * *